(12) United States Patent
Argyres et al.

(10) Patent No.: US 7,856,524 B2
(45) Date of Patent: Dec. 21, 2010

(54) TRANSPOSING OF BITS IN INPUT DATA TO FORM A COMPARAND WITHIN A CONTENT ADDRESSABLE MEMORY

(75) Inventors: Dimitri C. Argyres, San Jose, CA (US); Varadarajan Srinivasan, Los Altos Hills, CA (US)

(73) Assignee: NetLogic Microsystems, Inc., Santa Clara, CA (US)

( * ) Notice: Subject to any disclaimer, the term of this patent is extended or adjusted under 35 U.S.C. 154(b) by 75 days.

(21) Appl. No.: 12/168,600

(22) Filed: Jul. 7, 2008

(65) Prior Publication Data

US 2008/0288721 A1 Nov. 20, 2008

Related U.S. Application Data

(60) Division of application No. 10/801,462, filed on Mar. 15, 2004, now Pat. No. 7,412,561, which is a continuation-in-part of application No. 10/047,754, filed on Jan. 14, 2002, now Pat. No. 7,237,058.

(51) Int. Cl.
*G11C 15/00* (2006.01)
*G06F 13/16* (2006.01)

(52) U.S. Cl. ..................... 711/108; 365/49.17

(58) Field of Classification Search ........................ None
See application file for complete search history.

(56) References Cited

U.S. PATENT DOCUMENTS

| | | | |
|---|---|---|---|
| 3,648,254 A | 3/1972 | Beausoleil | |
| 4,845,668 A | 7/1989 | Sano et al. | |
| 4,958,377 A | 9/1990 | Takahashi | |
| 4,996,666 A | 2/1991 | Duluk, Jr. | |
| 5,319,762 A | 6/1994 | Mayer | |
| 5,414,704 A | 5/1995 | Spinney | |
| 5,438,535 A | 8/1995 | Lattibeaudiere | |
| 5,444,649 A | 8/1995 | Nemirovsky | |
| 5,479,112 A | 12/1995 | Choi et al. | |
| 5,497,488 A * | 3/1996 | Akizawa et al. | ................. 707/6 |
| 5,642,322 A | 6/1997 | Yoneda | |
| 5,808,927 A | 9/1998 | Hesson | |
| 5,860,085 A | 1/1999 | Stormon et al. | |
| 5,870,324 A | 2/1999 | Helwig et al. | |
| 5,920,886 A | 7/1999 | Feldmeier | |
| 5,956,336 A | 9/1999 | Loschke et al. | |
| 5,978,885 A | 11/1999 | Clark, II | |
| 6,041,389 A | 3/2000 | Rao | |
| 6,069,573 A | 5/2000 | Clark, II et al. | |
| 6,081,440 A | 6/2000 | Washburn et al. | |
| 6,081,442 A | 6/2000 | Igarashi et al. | |
| 6,098,147 A | 8/2000 | Mizuhara | |
| 6,121,791 A | 9/2000 | Abbott | |
| 6,161,144 A | 12/2000 | Michels et al. | |

(Continued)

*Primary Examiner*—Gary J Portka
(74) *Attorney, Agent, or Firm*—Mahamedi Paradice Kreisman LLP; William L. Paradice, III

(57) ABSTRACT

An apparatus and method of transposing one or more bits in input data relative to other bits of the input data to form a comparand for searching in a content addressable memory. The comparand may have one or more bits rearranged from their order appearing in the input data such that one or more bits from a first segment of the input data are replaced with, or substituted by, one or more bits from a second segment of the input data.

6 Claims, 13 Drawing Sheets

U.S. PATENT DOCUMENTS

| | | |
|---|---|---|
| 6,226,710 B1 | 5/2001 | Melchior |
| 6,243,281 B1 | 6/2001 | Pereira |
| 6,324,087 B1 | 11/2001 | Pereira |
| 6,351,142 B1 | 2/2002 | Abbott |
| 6,353,873 B1 * | 3/2002 | Melchior .................... 711/108 |
| 6,374,326 B1 | 4/2002 | Kansal et al. |
| 6,424,659 B2 | 7/2002 | Viswanadham et al. |
| 6,629,099 B2 | 9/2003 | Cheng |
| 6,633,953 B2 | 10/2003 | Stark |
| 7,003,625 B2 * | 2/2006 | King .......................... 711/108 |
| 2002/0015348 A1 | 2/2002 | Gillingham et al. |
| 2002/0126672 A1 | 9/2002 | Chow et al. |
| 2003/0005146 A1 | 1/2003 | Miller et al. |
| 2003/0039135 A1 | 2/2003 | Srinivasan et al. |
| 2003/0084236 A1 | 5/2003 | Khanna et al. |
| 2004/0128434 A1 | 7/2004 | Khanna et al. |

* cited by examiner

TRANSPOSING OF BITS IN INPUT DATA TO FORM A COMPARAND WITHIN A CONTENT ADDRESSABLE MEMORY

REFERENCE TO RELATED APPLICATION

This application is a divisional, and claims the benefit under 35 USC §120, of commonly owned and U.S. patent application Ser. No. 10/801,462 filed Mar. 15, 2004 now U.S. Pat. No. 7,412,561, which is a continuation-in-part of U.S. application Ser. No. 10/047,754 filed Jan. 14, 2002 now U.S. Pat. No. 7,237,058, both of which are incorporated by reference herein.

TECHNICAL FIELD

This invention relates generally to the field of memory devices. More specifically, the invention relates to content addressable memory devices.

BACKGROUND

Networks contain a collection of computing systems (e.g., clients and servers) that are interconnected by transmission lines to enable the transfer of data between them. A network typically includes multiple access points (e.g., routers and servers) that may switch and/or route data between transmission lines to transfer data from a source to a destination. Data is typically transmitted in the form of packets that are made up of smaller data cells. A packet is a unit of data that is routed between a source and a destination on a packet-switched network. When a file (e.g., e-mail, graphics, etc.) is sent from one place to another on a network, the file is divided into such smaller packets making them more efficient for transmission. The individual packets for a given file may travel different routes throughout networks with each packet containing both data and transmission information associated with the routing of data. As such, a packet may be described as having a payload containing the data, and one or more headers that contain the routing information (e.g., a destination address).

When all the packets have arrived at a destination, they are reassembled into the original file at the receiving end. Such a packet switching scheme is an efficient way to handle transmission on a connectionless network. This is in contrast to a circuit switching scheme where a connection (e.g., a voice connection) requires the dedication of a particular path for the duration of the connection.

A router is a device (e.g., hardware, firmware, software) that determines the next network segment to which a packet should be forwarded towards its destination. A router may be positioned at points within a network or where one network meets another, referred to as a gateway. A router may create and maintain tables of the available routes and their conditions for use with other information to determine the best route for a given packet. Typically, a packet may travel through a number of network points having routers before arriving at its destination.

When a data packet arrives at the input of a router, several lookups may be performed to determine the subsequent handling of the packet, as illustrated in FIG. 1. The lookups may include, for examples, where to send the packet next (Next Hop), the quality of service requirement (QoS), the Ethernet port address, etc. Consider, for example, a packet arriving at Router-A. Router-A needs to determine whether the packet is destined for local servers connected directly to Router-A, or if the packet should go to the next router on a route (Router-B) to a destination. Additionally, Router-A may assign a priority based on the destination address (DA) and the source address (SA) of the packet.

The packet header may first be processed to get the values from different fields (e.g., SA, DA, protocol type, QoS, etc) in order to perform the various lookups. A packet classification lookup, for example, may be performed using SA, DA and other relevant fields in the packet header. The Next Hop lookup, for example, may also be performed to determine whether the packet is meant for local servers or for Router-B. If the packet is destined for Router-B, the packet is then put in a queue for Router-B. If the packet is destined for a local server (e.g., Server-1 or Server-2), then a media access control (MAC) lookup is performed to send the packet to the appropriate server. In the preceding example, three lookups are necessary for sending the packet on its way: Packet Classification, Next Hop, and MAC. However, often there are other lookups performed on the packet header.

Routers may use processors and content addressable memory (CAM) devices to perform the various lookups on packets. A CAM device can be instructed by a processor to compare a search key, also referred to as comparand data (e.g., packet header data), with data stored in its associative memory array, as illustrated in FIG. 2. The CAM simultaneously examines all of its entries and selects the stored data that matches the comparand.

When the entire CAM device is searched simultaneously for a match of the stored data with the comparand data, the CAM device indicates the existence of a match by asserting a match flag. Multiple matches may also be indicated by asserting a multiple match flag. The CAM device typically includes a priority encoder to translate the matched location into a match address or CAM index and outputs this address to a status register so that the matched data may be accessed. The priority encoder may also sort out which matching memory location has the top priority if there is more than one matching entry.

A router may include multiple CAMs, with each CAM having a different table or, alternatively, a single CAM having multiple blocks for each of the different tables, for performing the different lookups. For example, a router may include a 32 bit wide Next Hop CAM, a 128 bit Classification CAM, and a 48 bit MAC CAM. With routers having multiple CAMs, each of the multiple CAMs are typically connected to common buses that are used to communicate the various keys and other input and output data with each of the CAM devices. With such a configuration common input data may be provided to the multiple CAM devices, or multiple blocks of single CAM device. However, different CAM devices, or different blocks within a multiblock CAM device, may require different portions of the input data to use as the comparand for performing a look-up in a particular table.

BRIEF DESCRIPTION OF THE DRAWINGS

The present invention is illustrated by way of example and not intended to be limited by the figures of the accompanying drawings.

DETAILED DESCRIPTION

Figure 1:
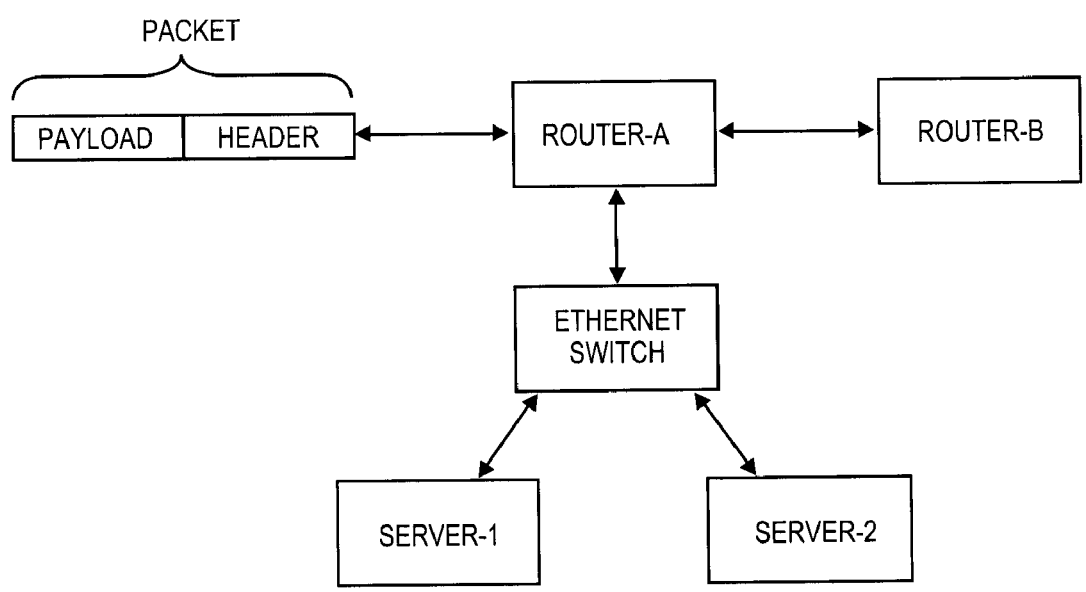
FIG. 1 illustrates an example of packet handling by a router.
Figure 2:
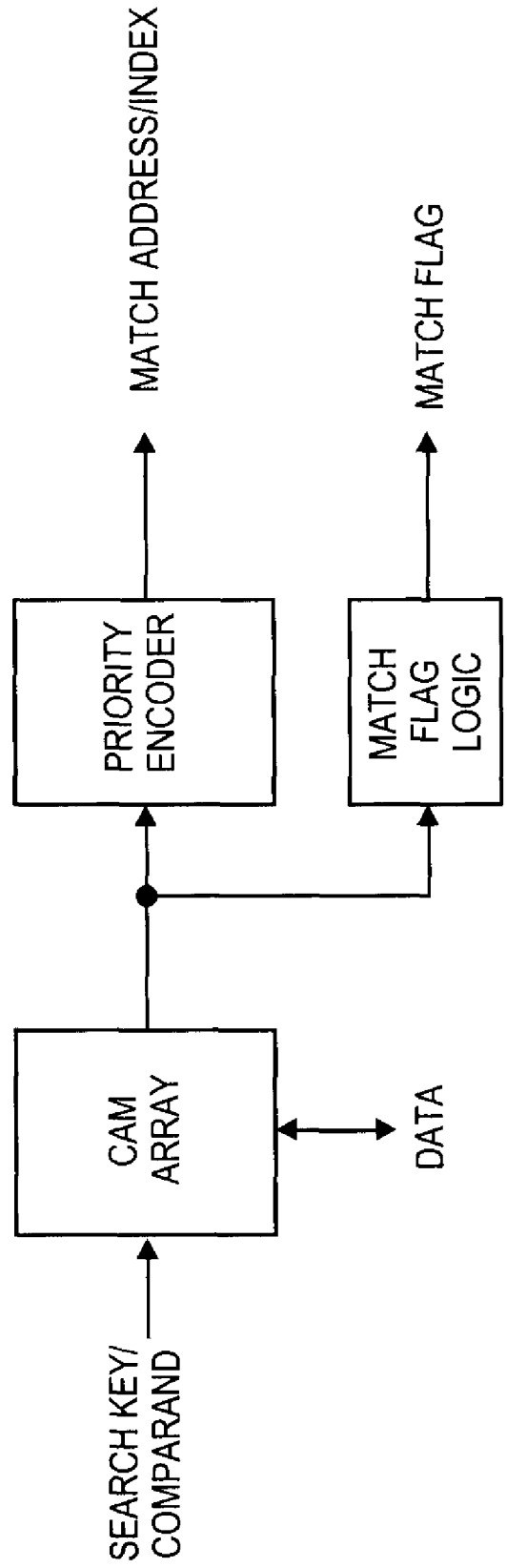
FIG. 2 illustrates one embodiment of a conventional CAM device.

In the following description, numerous specific details are set forth such as examples of specific components, circuits, processes, etc. in order to provide a thorough understanding of the present invention. It will be apparent, however, to one skilled in the art that these specific details need not be employed to practice the present invention. In other instances, well known components or methods have not been described in detail in order to avoid unnecessarily obscuring the present invention.

Embodiments of the present invention include various methods, which will be described below. The methods may be performed by hardware components or may be embodied in machine-executable instructions, which may be used to cause hardware components (e.g., a processor, programming circuit) programmed with the instructions to perform the methods. Alternatively, the methods may be performed by a combination of hardware and software.

Embodiments of the present invention may be provided as a computer program product, or software, that may include a machine-readable medium having stored thereon instructions. The machine readable medium may be used to program a computer system (or other electronic devices) to generate articles (e.g., wafer masks) used to manufacture embodiments of the present invention. The machine-readable medium may include, but is not limited to, floppy diskettes, optical disks, CD-ROMs, and magneto-optical disks, ROMs, RAMS, EPROMs, EEPROMs, magnet or optical cards, flash memory, or other type of media/machine-readable medium suitable for storing electronic instructions.

The machine readable medium may store data representing an integrated circuit design layout that includes embodiments of the present invention. The design layout for the integrated circuit die may be generated using various means, for examples, schematics, text files, gate-level netlists, hardware description languages, layout files, etc. The design layout may be converted into mask layers for fabrication of wafers containing one or more integrated circuit dies. The integrated circuit dies may then be assembled into packaged components. Design layout, mask layer generation, and the fabrication and packaging of integrated circuit dies are known in the art; accordingly, a detailed discussion is not provided.

It should be noted that the steps and operations discussed herein (e.g., the loading of registers) may be performed either synchronously or asynchronously. The term "coupled" as used herein means connected directly to or connected through one or more intervening components or circuits. Any of the signals provided over various buses described herein may be time multiplexed with other signals and provided over one or more common buses. Additionally, the interconnection between circuit elements or blocks may be shown as buses or as single signal lines. Each of the buses may alternatively be single signal lines, and each of the single signal lines may alternatively be buses. Additionally, the prefix symbol "/" or the suffix "B" attached to signal names indicates that the signal is an active low signal. Each of the active low signals may be changed to active high signals as generally known in the art. A line over an operand such as "$\overline{A}$" means the logical compliment of the operand.

The methods and apparatus described herein may be used to transpose one or more bits (or groups of bits such as a byte) in an input data relative to other bits in the input data to form a comparand for searching in a content addressable memory. The comparand may have one or more bits (or group of bits) rearranged from their order appearing in the input data such that one or more bits (or group of bits) from a first segment of the input data are replaced with, or substituted by, one or more bits (or group of bits) from a second segment of the input data. The one or more bits from the first segment of input data that form the comparand maintain the same order in the comparand as their order in the first segment of input data. The replacement one or more bits (from the second segment) occupy the positions in the comparand as the replaced one or more bits (from the first segment) would have occupied in the comparand had they been used to form the comparand.

The apparatus includes a filter circuit that transposes the input data, according to the needs of the user. The filter circuit includes switch circuitry (e.g., a cross-bar switch, switch matrix, switch fabric, etc.) and control logic. The control logic selects or enables particular switch paths of the switch circuit to provide one or more bits (or groups of bits) from the input data to particular positions in the comparand.

Figure 3:
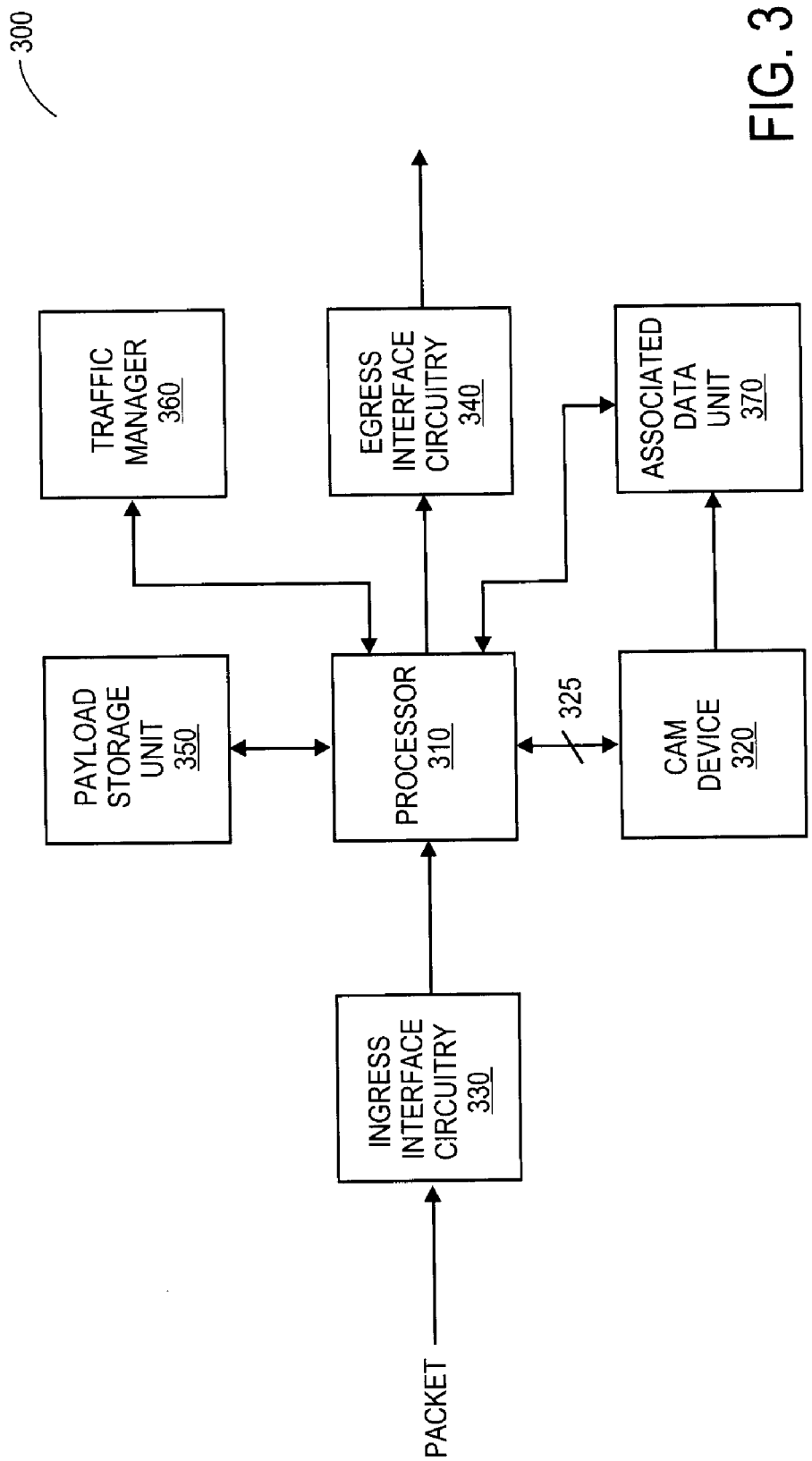
FIG. 3 illustrates one embodiment of a line card or blade of a router having a CAM device configured according to one embodiment of the present invention.

FIG. 3 illustrates one embodiment of a line card or blade of a router having a CAM device. Line card 300 includes processor 310, ingress interface circuitry 330, egress interface circuitry 340, CAM device 320, associated data storage unit 370, traffic manager 360, and payload storage unit 350.

Processor 310 functions to control the overall operation of line card 300 in cooperation with the other components of line card 300. For example, processor 310 receives packets from a network medium through ingress interface circuitry 330, stores the payload of packets in payload storage unit 350, and processes packet header information to determine required lookups in CAM device 320 and subsequent handling of the packets, as discussed herein. Ingress circuitry includes, for example, physical layer (PHY) and MAC devices. Processor 310 sends out packets on a network medium through egress interface circuitry 340 based on the lookups performed by CAM device 320. Egress interface circuitry 340 may be connected to a switch fabric or directly to one or more other routers or switches. Processor 310 may be one or more network processor units (NPUs), microprocessors, or one or more special purpose processors such as a digital signal processor (DSP). In another embodiment, processor 310 may be another type of controller, for example, a field programmable gate array or a general purpose processor. The processor 310, ingress interface circuitry 330, and egress interface circuitry 340 components of a router are known in the art; accordingly, a detailed discussion is not provided.

In response to information in a packet header, for a particular packet, processor 310 determines the number and types of lookups to be performed by one or more of CAM devices 320, and forms the search keys for these lookups. The searches or lookups may include, for example, classification lookups, forwarding lookups (e.g., Next Hop or longest prefix match (LPM) lookup, MAC lookup, MPLS lookup, etc.). When multiple searches are required, processor 310 forms a composite search key that includes at least two, and as many as all, of the various search keys for the lookups. The composite search key is provided as a common input data to CAM device 320. CAM device 320 selectively identifies and extracts the individual search keys from the common input data and provides the individual search keys to the associated CAM blocks to perform the lookups. Advantageously, the lookups can then occur concurrently or simultaneously in the CAM blocks of CAM device 320, thereby increasing overall throughput over conventional systems in which searches are processed sequentially.

CAM device 320 may be a multiple block CAM device with each block having a corresponding filter circuit, as discussed below, to generate a comparand for a lookup. Alternatively, CAM device 320 may represent multiple, single block CAM devices (e.g., with each single block CAM device formed on a different integrated circuit substrate) with each CAM device having a corresponding filter circuit. After one or more lookups are executed in CAM device 320, associated information for matching entries (e.g., additional routing information and/or packet information) may be retrieved from associated data unit 370. Processor 310 then communicates with traffic manager 360 to schedule the exit of a packet from line card 300 via egress interface circuitry 340.

Figure 4:
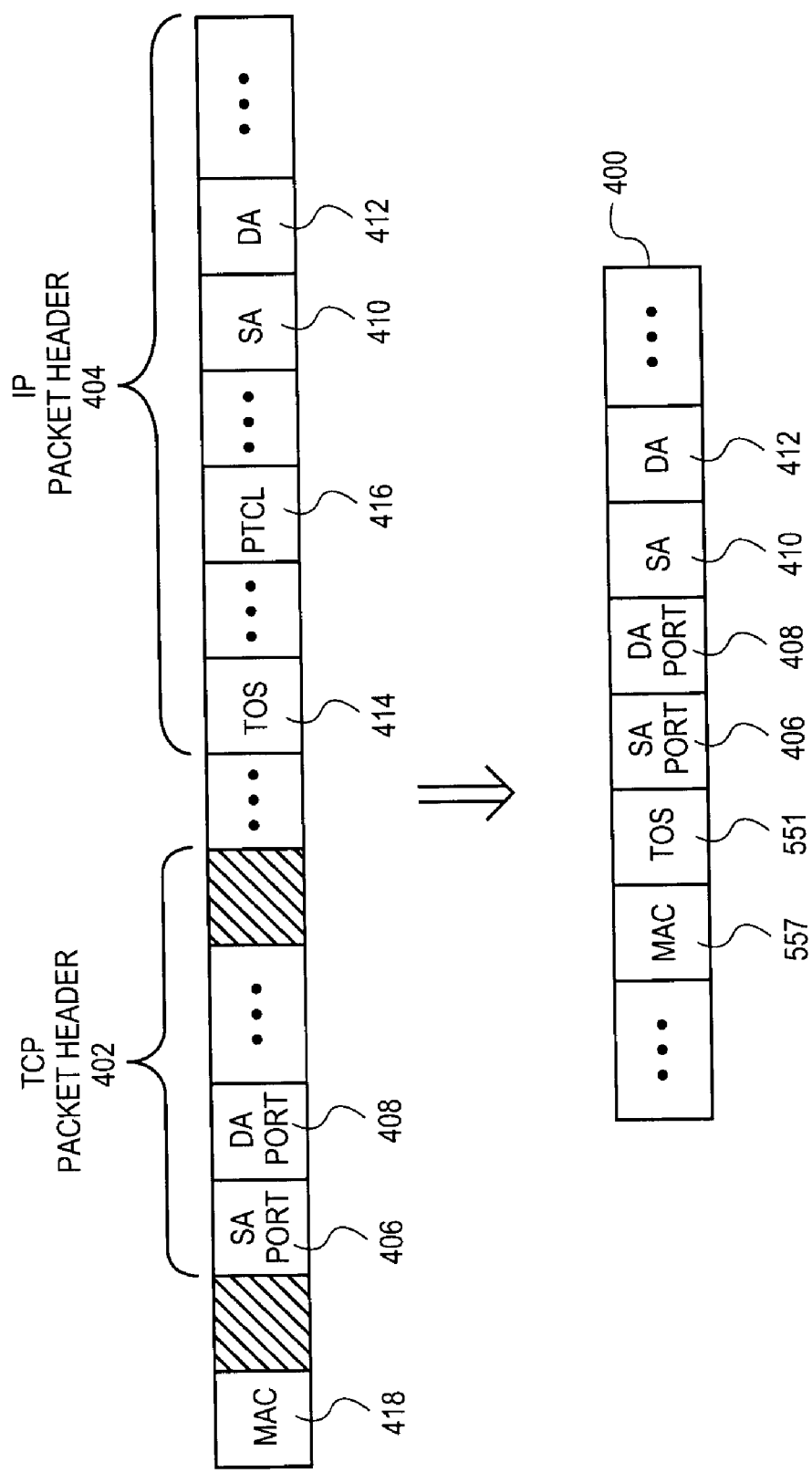
FIG. 4 illustrates one embodiment of a lookup string.

FIG. 4 illustrates one embodiment of an input data string. Input data 400 includes field segments processed (e.g., separated) from one or more packet headers 402 and 404. When data processing systems (e.g., routers, clients, servers) exchange data over a network, the procedure involves the use of protocols by which these systems agree on how to communicate with each other. To reduce design complexity, networks may be organized as a series of layers. The number of layers and the function of each layer varies from network to network.

For example, where a transmission control protocol (TCP)/Internet protocol (IP) is used, it is organized into multiple layers including a network access layer and an Internet layer. The network access layer uses a TCP to enable the exchange of data between an end system and a network. An Internet layer uses an IP to enable data to transverse multiple interconnected networks. Each of these protocols uses packet headers containing routing information, as discussed above. For example, TCP packet header 402 includes a source address (SA) port segment 406 and a destination address (DA) port segment 408, and IP packet header 404 includes a SA segment 410, a DA segment 412, a type of service (ToS) segment 414, and a protocol type segment 416.

In one embodiment, for example, processor 310 of FIG. 3 may be used to process certain segments from packet headers 402 and 404 to generate input data 400 and transmit the input data to CAM device 320. For example, input data 400 may include MAC segment 418, TOS segment 414, SA port segment 406, DA port segment 408, SA segment 410, and DA segment 412. Alternatively, input data 400 may include more or less than the segments illustrated. A filter circuit (illustrated in FIG. 5) may then filter out the bit values of different field segments of input data 400 to generate a filtered comparand to perform a lookup in a CAM array. In an alternative embodiment, processor 310 may transmit as-received unprocessed header segments to CAM device 320.

Figure 5:
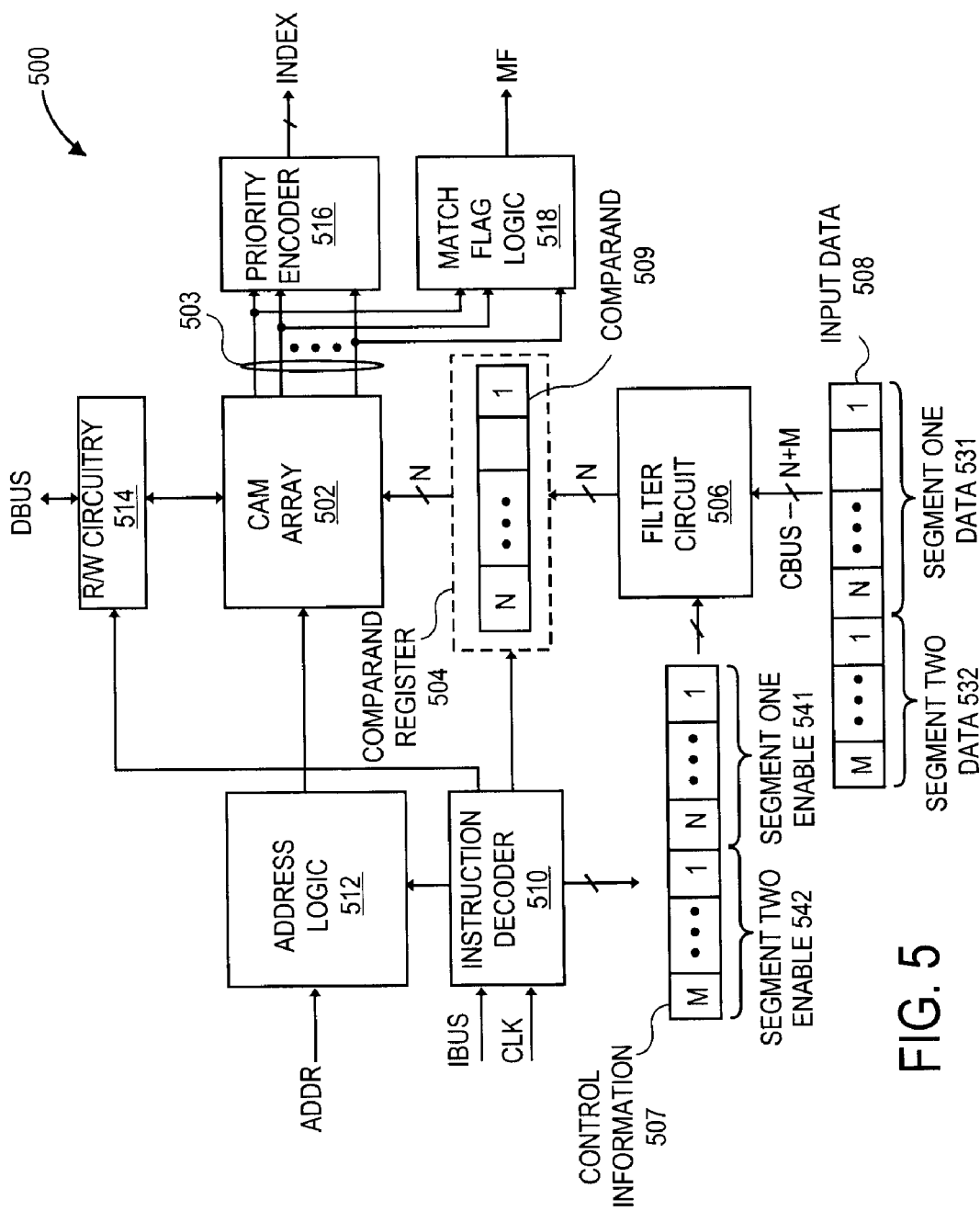
FIG. 5 illustrates one embodiment of a CAM device having a filter circuit.

FIG. 5 illustrates CAM device 500 that is, for example, one embodiment of CAM device 320 of FIG. 3. CAM device 500 includes address circuit 512, instruction decoder 510, CAM array 502, read/write (R/W) circuitry 514, priority encoder 516, match flag logic 518, comparand register 504 and filter circuit 506. Additional circuits such as, for example, error detection logic, multiple match flag logic, full flag logic, almost full flag logic, etc. may also be used. Alternatively, the flag logic may be omitted.

Instruction decoder 510 decodes various instructions provided on instruction bus IBUS (e.g., instructions to write or read data from CAM array 502 and to compare comparand data with one or more segments of the CAM array) and provides various control and/or timing signals to address circuit 512, filter circuit 506, R/W circuitry 514, and comparand register 504, to control when CAM device 500 performs an operation (e.g., a read, write or compare operation). Instruction decoder 510 may also provide various control and/or timing signals to CAM array 502, priority encoder 516 and match flag logic 518. The instruction decoder 510 may be, for example, a look-up table, state machine or other control logic. In an alternate embodiment, instruction decoder 510 is omitted and various read, write and compare control signals are provided directly to one or more of the circuit blocks.

In one embodiment, input data 508 includes N+M bits, where M is the number of bits (or group of bits) in a second data segment 532 of input data 508 and N is the number of bits (or group of bits) in a first data segment of input data 508, where M and N are each greater than or equal to one. Input data 508 may be generated by, for example, processor 310 of FIG. 300.

Filter circuit 506 receives input data 508 and control information 507 that is used to program filter circuit 506 to generate a particular comparand from input data 508. The control information 507 may be received from instruction decoder 510 or, alternatively, from other components such as directly from processor 310 of FIG. 300. In one embodiment, filter circuit 506 includes switch circuitry (e.g., a cross-bar switch, switch matrix, switch fabric, etc.) and control logic, as discussed below in relation to FIG. 7. Filter circuit 506 transposes one or more bits (or group of bits) from their position(s) in input data 508 to their position(s) in comparand 509 based on the control information 507.

In one embodiment, CAM array 502 is coupled to comparand register 504 that receives a comparand 509 from filter circuit 506 for comparison with data stored in one or more CAM cells of CAM array 502. During a compare operation, CAM array 502 is searched for a match with comparand 509. The comparand 509 may be stored in a comparand storage element, for example, comparand register 504 before a compare operation (look-up) in CAM array 502 is performed. Alternatively, the comparand 509 may be provided directly to CAM array 602 through comparand drivers (not shown) without being stored in comparand register 504. The CAM device 500 may also include one or more global mask registers (not shown) to mask certain portions of comparand 509 provided to CAM array 502.

CAM array 502 is an array of CAM cells that includes any number of rows of CAM cells that may be any type of CAM cells including, for example, binary and ternary NAND and NOR based cells that may be formed from either volatile or non-volatile elements. Each CAM cell includes at least one memory storage element and at least one compare circuit. Other embodiments may be used to effectively implement an array of CAM cells.

Data to be written to CAM array 502 may be received from DBUS. The data is written to CAM array 502 by read/write circuitry 514 and address logic 512. Address logic 512 selects one or more rows of CAM cells in response to an address provided over ADDR. The write data is provided to the selected cells (e.g., over one or more data bit lines) by the write circuitry portion of read/write circuitry 514 (e.g., write buffers). The read circuitry portion of read/write circuitry 654 (e.g., sense amplifiers) enables data to be read from one or more selected rows of CAM array 502. The data read from CAM array 502 may be output from the read/write circuitry 514 on the DBUS or any other bus (e.g., CBUS).

When CAM array 502 is searched for a match of the stored data with the comparand 509, each matching location indicates a match on one of match lines 503. Match flag logic 518 indicates the existence of a match if at least one of the match lines 503 carries a match signal indicating a match. Additional flag logic such as almost full flag logic, full flag logic, and/or multiple match flag logic may also be included in CAM device 500.

Priority encoder 516 translates a matched location(s) into an index (or a match address) and outputs this index that may be used, for example, by processor 310 of FIG. 3 or to access associated data unit 370 of FIG. 3. Priority encoder 516 also identifies which matching location has the top priority if there is more than one matching entry.

Any of the signals provided over IBUS, DBUS, CBUS or ADDR may be time multiplexed with other signals and provided over one or more of the other buses. The buses may be coupled to processor 310 as represented by bus 325 of FIG. 3. In an alternative embodiment, CAM device 500 may include multiple CAM arrays 502 (and corresponding filter circuits 506) each forming a block as discussed below in relation to FIG. 12. A block may be an entire array, a portion of a larger array, or include multiple arrays. Each array in a block may store a different lookup table or portions of one or more common lookup tables. Alternatively, a block may store multiple lookup tables. Multiple block CAM devices are known in the art; accordingly, a more detailed discussion is not provided.

Figure 6:
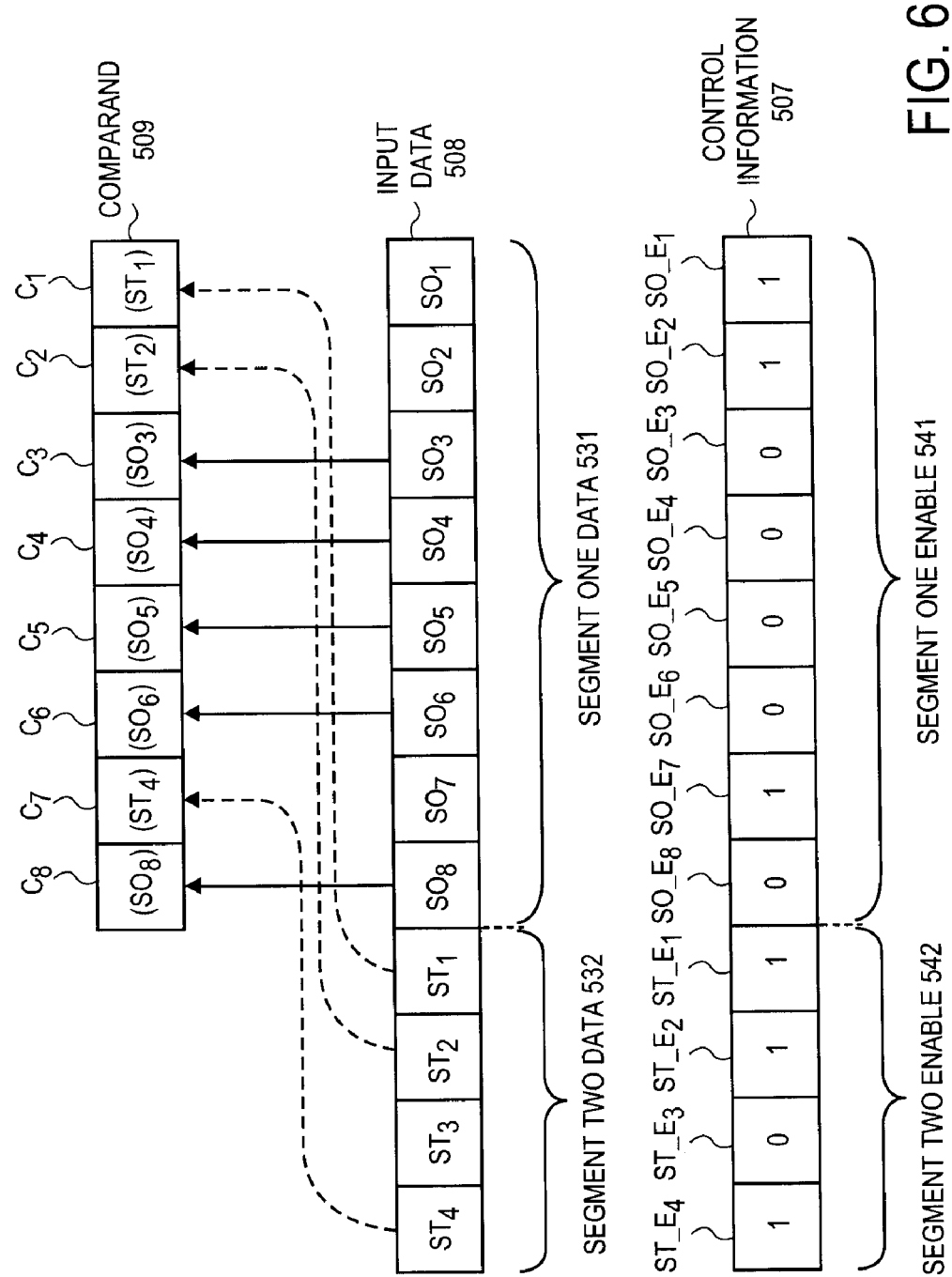
FIG. 6 is a conceptual illustration of an exemplary embodiment of bit transposition.

FIG. 6 conceptually illustrates an exemplary embodiment of bit transposition. Each of the units/positions of the input data, control information and comparand may be discussed herein as a referring to a bit only for ease of discussion. It should be noted that, each unit/position might represent a group of bits having one or more bits within the group (e.g., a byte).

In one embodiment, input data 508 includes a first segment of data (segment one data) 531 and a second segment of data (segment two data) 532. There may be a one-to-one correspondence between the bit positions of segment one data 531 and the bit positions of comparand 509, without bit transposition, such that, for example, bit $SO_1$ of input data 508 is used to form bit $C_1$ and bit $S0_8$ is used to form bit $C_8$ of comparand 509. Filter circuit 506 is used to transpose bits, based on control information 507, of the segment two data 532 to particular bit positions in the comparand 509 that might have otherwise been occupied by bits of the segment one data 531 without such transposition. In the particular, bits from segment one data 531 may be replaced by, or substituted with, bits from segment two data 532 in forming the comparand 509. The bits from the segment one data 531 that are used to form the comparand maintain the same order in the comparand 509 as their order in the segment one data 531 of input data 508. The replacement bits (from the segment two data 532) occupy the same positions in the comparand 509 as the replaced bits (from the segment one data) would have occupied in the comparand had the replaced bits been used to form the comparand 509.

For the exemplary embodiment shown in FIG. 6, bits $SO_1$, $SO_2$ and $SO_7$ of segment one data 531 (that might otherwise have formed bits $C_1$, $C_2$ and $C_7$ of comparand 509 without transposition) are replaced with bits $ST_1$, $ST_2$ and $ST_4$ of the segment two data 532 to form comparand 509 based on the bit values of control information 507. In this exemplary embodiment, a "1" bit value in the segment one enable 541 bit positions of control information 507 is used to indicate that a corresponding segment one data 531 bit is to be used to form comparand 509, while a "1" bit value in the segment two enable 542 bit positions is used to indicate that a corresponding bit of segment two data 532 is to be used as a substitution (in order of their position in the segment two data string starting from $ST_1$ to $ST_4$) to form comparand 509. In an alternative embodiment, the substitution queue of segment two data 532 may start from its other end (e.g., $ST_4$).

As such, the "0"s in segment one enable 541 bit positions $SO\_E_3$ to $SO\_E_6$, and $SO\_E_8$ indicate that corresponding segment one data 531 bits $S0_3$ to $S0_6$ and $S0_8$ are to be used to form comparand 509 in corresponding bit positions $C_3$ to $C_6$ and $C_8$. The "1"s in segment one enable 541 bit positions $SO\_E_1$, $SO\_E_2$, and $SO\_E_7$ indicate that corresponding segment one data 531 bits $S0_1$, $S0_2$ and $S0_7$ are to be replaced by bits from segment two data 532. The particular bit of segment two data 532 that is to be used to replace a particular bit of segment one data 531 in forming comparand 509 is determined by the "1" bit values in segment two enable 542. The "1" in segment two enable 542 bit positions $ST\_E_1$, $ST\_E_2$ and $ST\_E_4$ indicate that the bits in corresponding segment two data 532, $ST_1$, $ST_2$ and $ST_4$ are to be used (in their order within segment two data 532 starting with $ST_1$) to form comparand 509 in comparand positions $C_1$, $C_2$ and $C_7$, respectively. In alternative embodiment, a "0" rather than a "1" bit value may be used to indicate a selection.

Figure 7:
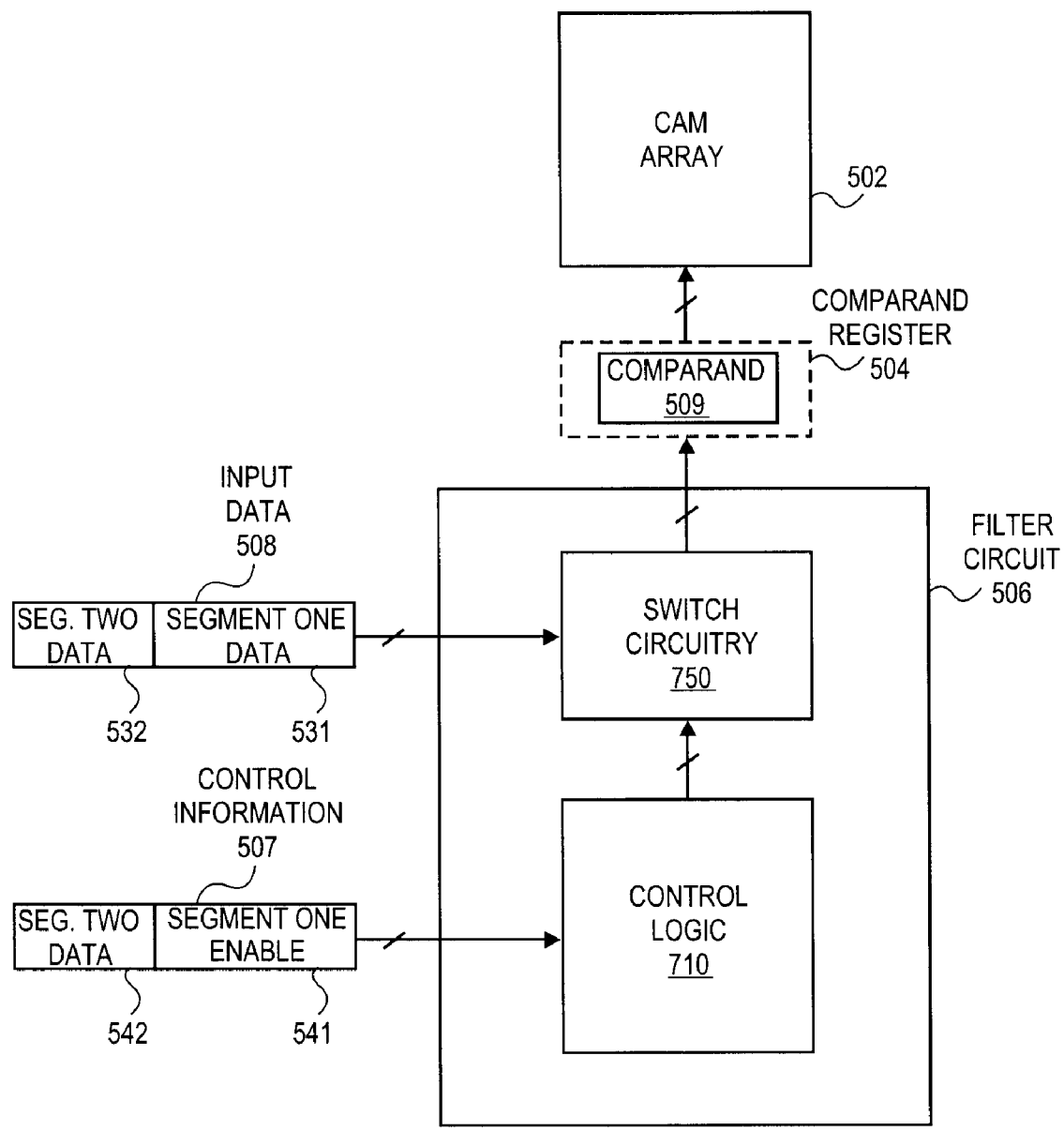
FIG. 7 illustrates one embodiment of the filter circuit of FIG. 5.

Filter circuit 506 of FIG. 7 is used to transpose the bits $ST_1$, $ST_2$ and $ST_4$ of the segment two data 532 to form bits $C_1$, $C_2$ and $C_7$, respectively, of the comparand 509. While filter circuit 506 selects bits $SO_3$, $SO_4$, $SO_5$, $SO_6$, and $SO_8$ of segment one data 531 to form bits $C_3$, $C_4$, $C_5$, $C_6$, and $C_8$ of comparand 509, respectively, maintaining their positional correspondence in comparand 509 with respect to segment one data 531 in input data 508.

FIG. 7 illustrates one embodiment of the filter circuit of FIG. 5. In this embodiment, filter circuit 506 includes switch circuitry 750 and control logic 710. Filter circuit 506 transposes one or more bits (or group of bits) from input data 508 to certain positions in comparand 509 (e.g., that, in one embodiment, may be stored in a comparand register 504) based on the control information 507. The control information 507 enables particular switch paths of the switch circuitry to provide the one or more bits from segment two data 532 of input data 508 to particular positions in the comparand 509 in substitute of one or more bits from segment one data 531. Switch circuitry 750 includes a plurality of switch circuits, or paths (as discussed below in relation to FIGS. 9 and 10B), which are controlled by control logic 710 to connect the bits of input data 508 with particular positions in comparand 509.

Figure 8:
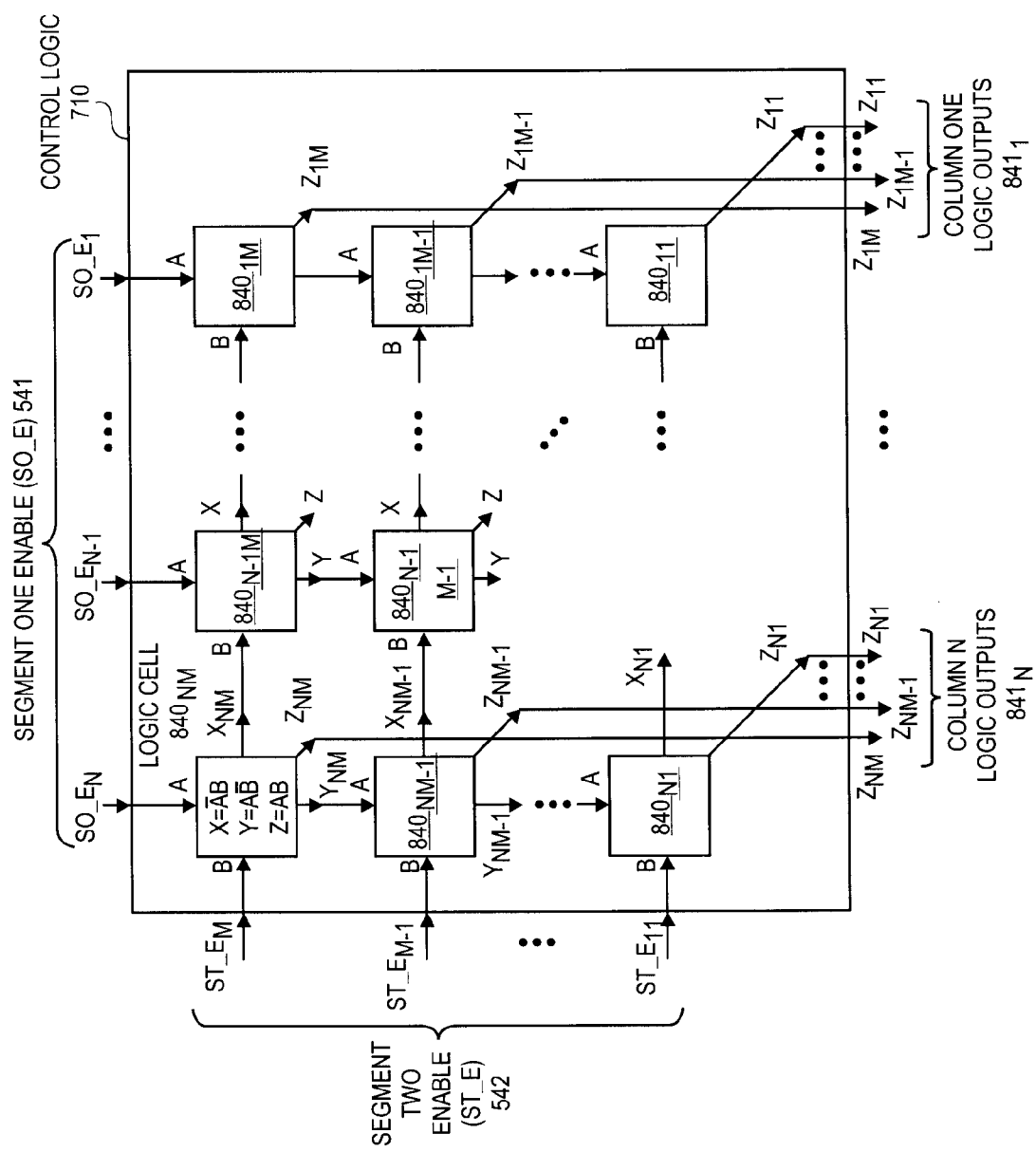
FIG. 8 illustrates one embodiment of the control logic of FIG. 7.

FIG. 8 illustrates one embodiment of the control logic of FIG. 7. Control logic 710 includes a plurality of logic cells 840 that are coupled in a matrix of N columns and M rows, where N is equal to or greater than 1 and M is equal to or greater than 2. Each of the N columns corresponds to one of the segment one enable signals 541 and each of the M rows corresponds to one of the segment two enable signals 542 of control information 541. Each of the plurality of logic cells 840 has two inputs coupled to receive an A operand and a B operand. The logic cells perform logic operations whose results may be output to succeeding logic cells in the matrix as the A operand and/or B operand of a succeeding logic cell.

Each of the logic cells performs at least an AB logic operation equaling variable Z that is output from control logic 710. The outputted results of the AB logic operations (the Zs) are used as control signals that are input to switch circuitry 750 to enable particular switch paths (e.g., a particular output of a multiplexer), as discussed below in relation to FIG. 9.

The control logic 710 includes a matrix of N by M logic cells $840_{NM}$ to $840_{11}$, where N and M are greater than or equal to 1. Each logic cell is configured to receive an A operand and a B operand, and perform the following logic operations: $\overline{A}B$, $A\overline{B}$, and AB. AB means a logic AND operation performed on operands A and B. $\overline{A}B$ means a logic AND operation performed on operands $\overline{A}$ and B, where $\overline{A}$ is the logical complement of operand A. $A\overline{B}$ means a logic AND operation performed on operands A and $\overline{B}$, where $\overline{B}$ is the logical complement of operand B. The results of the logic operations: $\overline{A}B$, $A\overline{B}$, and AB are represented by the variables X, Y and Z, respectively.

Each of the logic cells in column N of the control logic 710 matrix are coupled to receive a segment two enable signal 542 as a B operand. Each of the cells in row M of the control logic 710 matrix are coupled to receive a segment one enable 541 signal as the A operand. Each of the logic cells in column N (except, in one embodiment, the logic cell in the last row 1) performs an $A\overline{B}$ logic operation and outputs the result Y as an A operand to corresponding column N logic cell in rows M−1 to 1. Each of the logic cells also performs a $\overline{A}B$ logic operation and outputs the result X as a B operand to corresponding logic cell in column N−1. Each of the logic cells in column N also performs an AB logic operation and outputs the result Z. The Z outputs from each of the logic cells in a column forms column logic outputs $841_1$ to $841_N$ from control logic 710, with column N logic outputs $841_N$ corresponding to outputs $Z_{NM}$ to $Z_{N1}$ of logic cells $840_{NM}$ to $840_{N1}$ and column one logic outputs $841_1$ corresponding to the outputs $Z_{1M}$ to $Z_{11}$ of logic cells $840_{1M}$ to $840_{11}$. The column one logic outputs $841_1$ to column N logic outputs $841_N$ are supplied as control signals to switch circuitry 750 to effectively enable one of the segment two data bits.

Each logic cell in columns N−1 to 1 receives at its B input the X output result from an immediately preceding logic cell N to 2, respectively, in its same row. Additionally, each logic cell in rows M−1 to 1 receives at its A input the Y output result from an immediately preceding logic cell M to 2, respectively, in its same column.

It should be noted that the logic cells (e.g., logic cell NM) in the last row M need not, but may, perform the $A\overline{B}$ logic operation because there are no further rows of logic cells to receive the Y result. It should also be noted that the logic cells (e.g., logic cell $840_{11}$) in the last column 1 need not, but may, perform the $\overline{A}B$ logic operation because there are no further columns of logic cells to receive the X result.

In one embodiment, the logic cells 840 may be implemented with static or dynamic AND/OR gates. In one embodiment, logic cell 840 may implemented with a differential cascode voltage switch (DCVS) circuit. Alternatively, other types of circuits may be used to implement a logic cell 840, for example, static CMOS NAND and/or NOR gates. Such circuits are known in the art; accordingly a detailed description is not provided.

Figure 9:
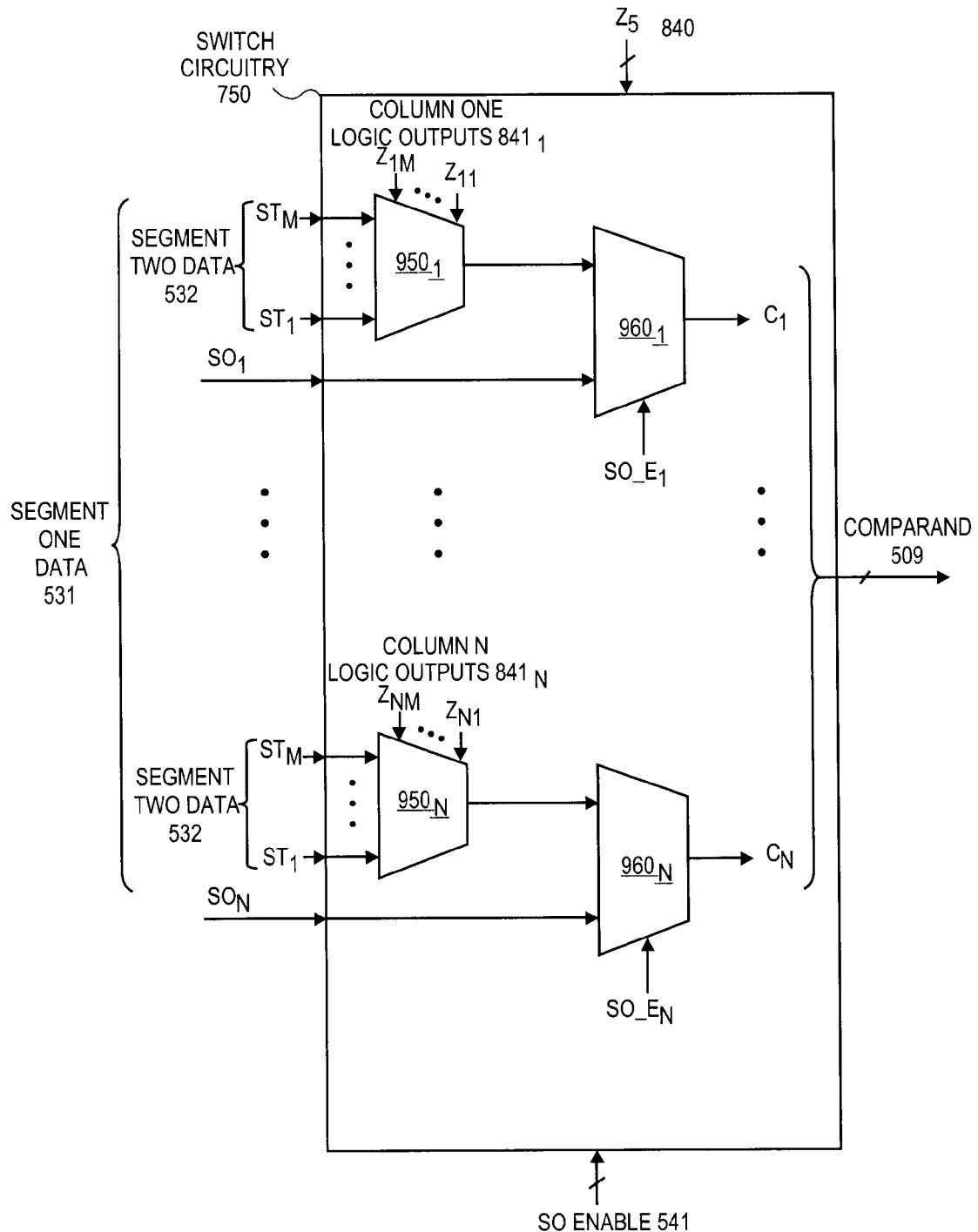
FIG. 9 illustrates one embodiment of the switch circuitry of FIG. 7.

FIG. 9 illustrates one embodiment of the switch circuitry of FIG. 7. Switch circuitry 750 is configured to receive the column logic outputs Z 840 from control logic 710, the segment one enable signals 541, and the segment one data 531 and segment two data 532 of input data 508. The column logic outputs Z 840 are used to selectively enable a bit of the segment two data 532 for multiplexing with a bit of the segment one data 531. The segment one enable signals 541 are used to selectively enable either a segment one data 531 bit or the selected bit of the segment two data 532 for output as a comparand 509 bit.

More particularly, in one embodiment, the switch circuitry 750 includes one or more input multiplexers $950_1$ to $950_N$ and one or more output multiplexers $960_1$ to $960_N$. Each of the input multiplexers $950_1$ to $950_N$ has M number of data inputs. Each of the input multiplexers $950_1$ to $950_N$ is coupled to receive corresponding segment two data 532 bits at its data inputs. Each of the input multiplexers $950_1$ to $950_N$ is also coupled to receive a corresponding group of column logic outputs 841 as control inputs that selectively outputs one of the segment two data 532 bits.

Each of the output multiplexers $960_1$ to $960_N$ has two data inputs. Each of the output multiplexers $960_1$ to $960_N$ is coupled to receive a corresponding one of the segment one data 532 bits on a first data input and a corresponding one of the outputs of the input multiplexers $950_1$ to $950_N$ on a second data input. Each of the output multiplexers $960_1$ to $960_N$ are also coupled to receive a corresponding one of the segment one enable signals 541 as a control input that selectively outputs either the segment one data 531 bit or the selected segment two data 532 bit for output as a bit $C_1$ to $C_N$ of comparand 509.

The term "multiplexer" as used herein refers to any component or configuration of circuitry that enables the selection of an output from among multiple data inputs based on the application of one or more control signals.

Referring now to both of FIGS. 8 and 9, it should be noted where segment two data 532 contains only a single bit for replacement of one of the segment one data 531 bits, control logic 710 need not be used. Rather, the segment two data 532 bit may be directly coupled to a data input of an output multiplexer 960 of switch circuitry 750 and the segment one enable signal 541 (corresponding to the segment one data 532) may be directly coupled as a control input to an output multiplexer 960 (without the need for control logic 710 or an input multiplexer 950 to select among multiple segment two data 532 bits).

An advantage of the control logic and switching scheme of filter circuit 506 is that it is scaleable such that a larger matrix can be used to handle smaller input data 508 strings (smaller size segment one data and/or segment two data than the number of columns and/or rows, respectively) by applying, for example, "0"s as the A and B operands for the logic cells in unused columns and/or rows of the matrix. Alternatively, the logic cells may be configured such that "1"s are applied to the A and B operands for logic cells in unused columns and/or rows of the matrix. Moreover, due to the similarity of the cells, the matrix can easily be expanded in a design to readily accommodate large input data strings. Other advantages of the architecture of filter circuit 560 shown in FIGS. 7 and 8, is that it results in a smaller die area and faster timing for large matrixes than with prior filter circuit architectures.

An example of the operation of control logic 710 and switch circuitry 750 is provided below in FIGS. 10A and 10B, respectively, in the context of the exemplary control information 507 provided in FIG. 6.

Figure 10A:
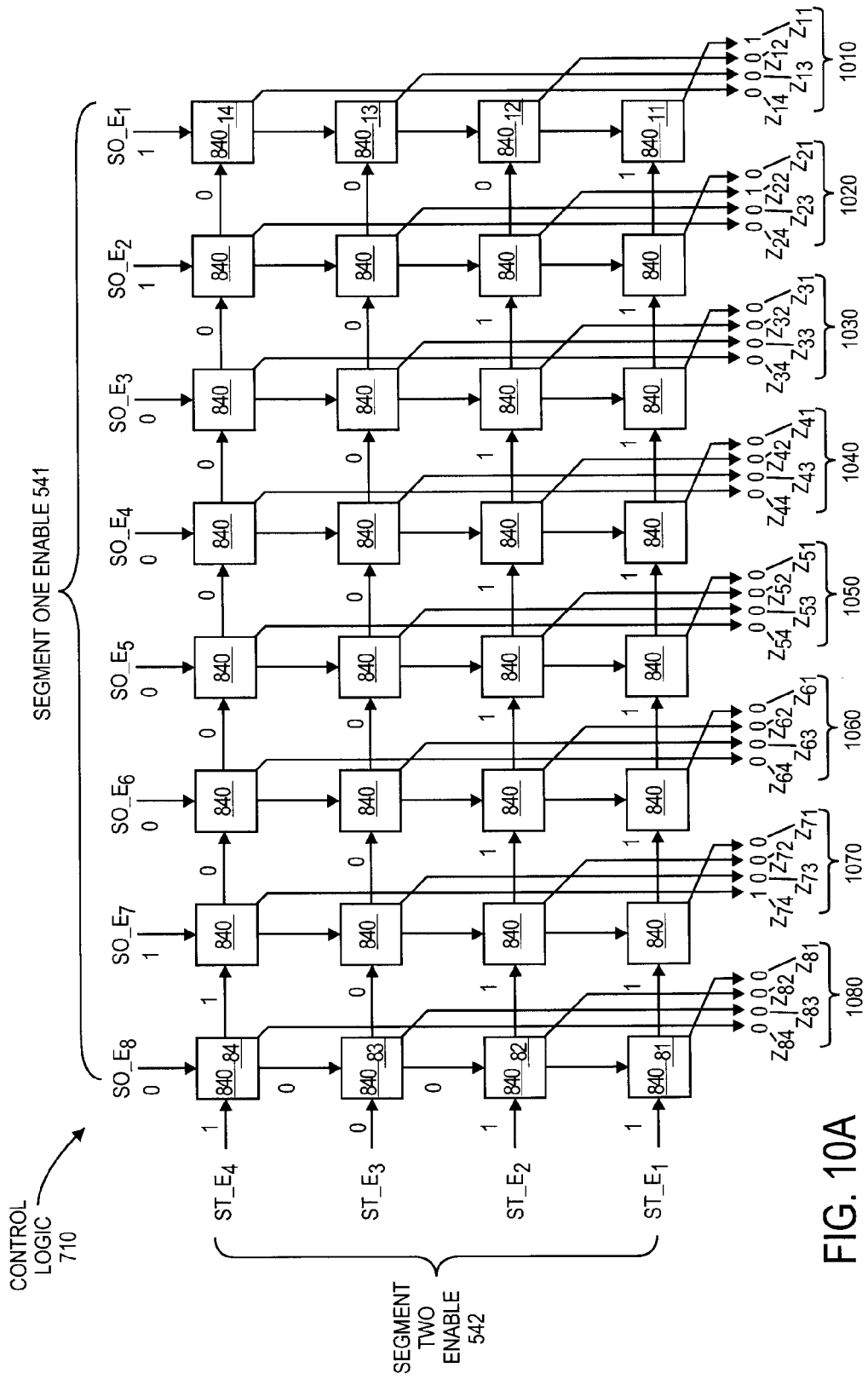
FIG. 10A illustrates one example of the operation of the control logic of FIG. 8.

FIG. 10A illustrates an exemplary operation of the control logic of FIG. 8 using the exemplary control information of FIG. 6. In this exemplary embodiment, there are eight segment one data bits having a corresponding number of segment one enable signal bits, and four segment two data bits having a corresponding number of segment two enable signal bits. As such, control logic 710 is composed of a matrix of N=8 columns and M=4 rows. Each of the 8 columns corresponds to one of the segment one enable signals 541 and each of the 4 rows corresponds to one of the segment two enable signals 542 of control information 541. The results of the logic operations in each logic cell are shown at each logic cell's output as the results propagate through the matrix.

The control logic Z outputs of two columns will be discussed below to illustrate the operation of the control logic 710 of FIG. 10A in conjunction with the switch circuitry 750 of FIG. 10B under (1) a condition where a bit from segment one data 531 is used to form the comparand 509 and (2) a bit from segment two data 532 is used to replace a bit from segment one data in order to form comparand 509. The "1" bit value in $SO\_E_1$ indicates that the $SO_1$ data of segment one data 531 should be replaced by a bit from segment two data 532, in order of their appearance, based on its selection as a replacement bit as determined by its corresponding segment two enable signals. In this exemplary embodiment, $ST_1$ of segment two data is considered the first bit in the order and its corresponding segment two enable bit $ST\_E_1$ is a "1" indicating $ST_1$ is to be used as a replacement bit for $SO_1$. As such, the $ST_1$ bit is intended as a replacement for segment one data bit $SO_1$ in comparand bit position $C_1$ (as conceptually illustrated in FIG. 6). The "0" bit value in $SO\_E_8$ indicates that its corresponding $SO_8$ bit in segment one data 531 should be used to form comparand 509 in comparand bit position $C_8$ (as also conceptually illustrated in FIG. 6).

The segment one and two enable signals are applied to control logic 710. In this exemplary embodiment, the bit values 0, 1, 0, 0, 0, 0, 1, 1 of segment one enable 541 signals $SO\_E_8$ to $SO\_E_1$, respectively, are applied to the A operand inputs of logic cells $840_{84}$ to $840_{14}$, respectively. The bit values 1, 1, 0, 1 of segment two enable 542 signals $ST\_E_1$ to $ST\_E_4$, respectively, are applied as the B operand inputs of logic cells $840_{81}$ to $840_{84}$. The results of the logic operations in each logic cell propagate through the matrix. As can be seen in FIG. 10A, $Z_{84}Z_{83}Z_{82}Z_{81}$ logic outputs 1080 are "0000" and the column one $Z_{141}Z_{13}Z_{12}Z_{11}$ logic outputs 1010 are "0001."

Figure 10B:
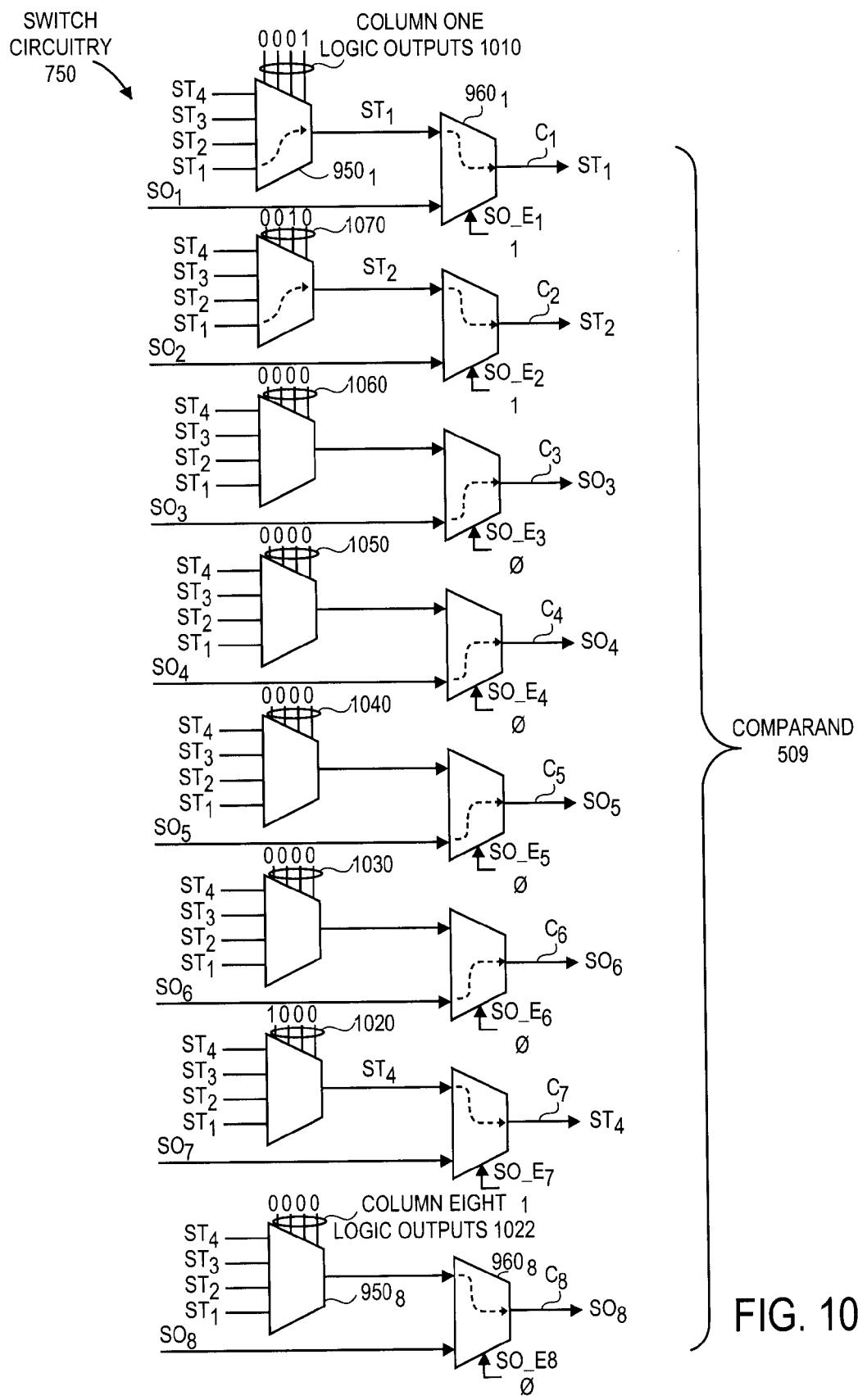
FIG. 10B illustrates one example of the switch circuitry of FIG. 9.

Referring now to FIG. 10B, the Z logic column outputs 1010-1080 are applied as control signals to the input multiplexers $950_1$ to $950_8$, respectively. The column one logic outputs 1010 of "0001" select the $ST_1$ data input as an output of multiplexer $950_1$, which is provided an input to multiplexer $960_1$. The $SO\_E_1$ enable signal is used as a control input to multiplexer $960_1$. The bit value of "1" of $SO\_E_1$ selects the $ST_1$ input as an output of multiplexer $960_1$ and, thereby, $ST_1$ is used to form $C_1$ of comparand 509 (as also conceptually illustrated in FIG. 6).

The column eight logic outputs 1080 of "0000" are applied as control inputs to multiplexer $950_8$, and do not select any of the segment two data inputs for output to multiplexer $960_8$. In one embodiment, the output of multiplexer $950_8$, such as in the example of FIG. 10B, may be tri-stated under such a condition. Alternatively, for another example, the output of multiplexer $950_8$ can be a default value. The $SO\_E_8$ enable signal is used as a control input to multiplexer $960_8$. The bit value of "0" of $SO\_E_8$ selects the $SO_8$ input as an output of multiplexer $960_8$ and, thereby, $SO_8$ is used to form $C_8$ of comparand 509 (as also conceptually illustrated in FIG. 6).

The other multiplexers of switch circuitry 750 operate in a similar manner to produce the comparand 509 having the following input data: $ST_1$, $ST_2$, $SO_3$, $SO_4$, $SO_5$, $SO_6$, $ST_4$, $SO_8$ in comparand positions $C_1$, $C_2$, $C_3$, $C_4$, $C_5$, $C_6$, $C_7$, $C_8$, respectively (as illustrated by the selection path of the dashed arrows within the multiplexers).

Figure 11:
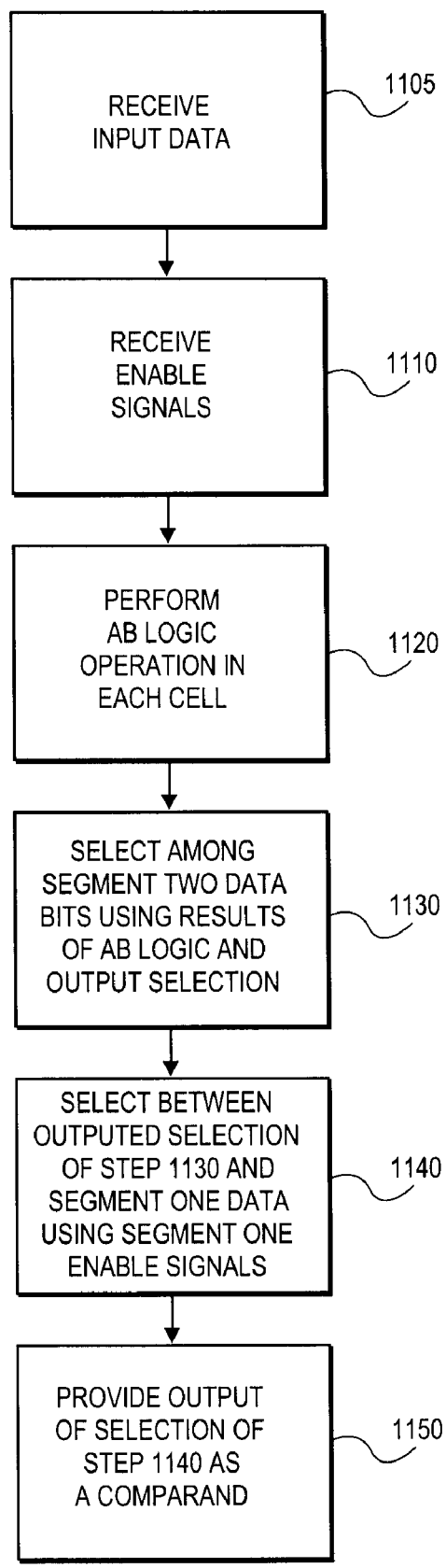
FIG. 11 illustrates one embodiment of a method of bit transposition in input data.

FIG. 11 illustrates one embodiment of a method of bit transposition in input data to form a comparand. In this embodiment, an input data 508 having segment one data 531 and segment two data 532 is received by switch circuitry 750 of filter circuit 506, block 1105. Segment one enable signals 541 and segment two enable signals 542 of control information 507 are received by control logic 710 of filter circuit 506, block 1110. The control information may be received either before, concurrent with, or after receipt of the input data 508. Next, an AB logic operation is performed in each of the logic cells of the matrix of control logic 710, block 1120.

In one embodiment, performing an AB logic operation in each of the logic cells includes providing the segment one enable signals 541 as the A operand to logic cells in a first row and providing the segment two enable signals 542 as the B operand to logic cells in a first column, in a matrix of N columns and M rows of the logic cells. Performing the AB logic operation in each of the logic cells further includes performing the following logic operations in each of the logic cells of the matrix rows and columns: $\overline{A}B$, $A\overline{B}$, and AB. Performing the AB logic operation in each of the logic cells further includes (1) receiving the result of the $\overline{A}B$ logic operation of a preceding logic cell in a row as the B operand in a succeeding cell in the row, and performing an AB logic operation in the N−1 number of succeeding logic cells in the row, and (2) receiving the result of the $A\overline{B}$ logic operation of a preceding logic cell in a column as the A operand in a succeeding cell in the column, and performing an AB logic operation in the M−1 number of succeeding logic cells in the column.

In block, 1130, the results of the AB logic operations of each of the matrix of logic cells of control logic 710 is provided as control inputs to multiplexers $950_1$ to $950_N$ to select among the segment two data 532 bits that are applied to data inputs of multiplexers $950_1$ to $950_N$. The output of multiplexers $950_1$ to $950_N$ and the segment one data 531 are provided as data inputs to multiplexers $960_1$ to $960_N$, respectively. The segment one enable signals 541 $SO\_E_N$ to $SO\_E_1$ are provided as control inputs to $960_N$ to $960_1$, respectively, to select between the output selection of block 1130 and the segment one data 531 $SO_N$ to $SO_1$, respectively, block 1140. In block 1150, the output selection of block 1140 is provided as bits $C_1$ to $C_8$ of comparand 509.

Figure 12:
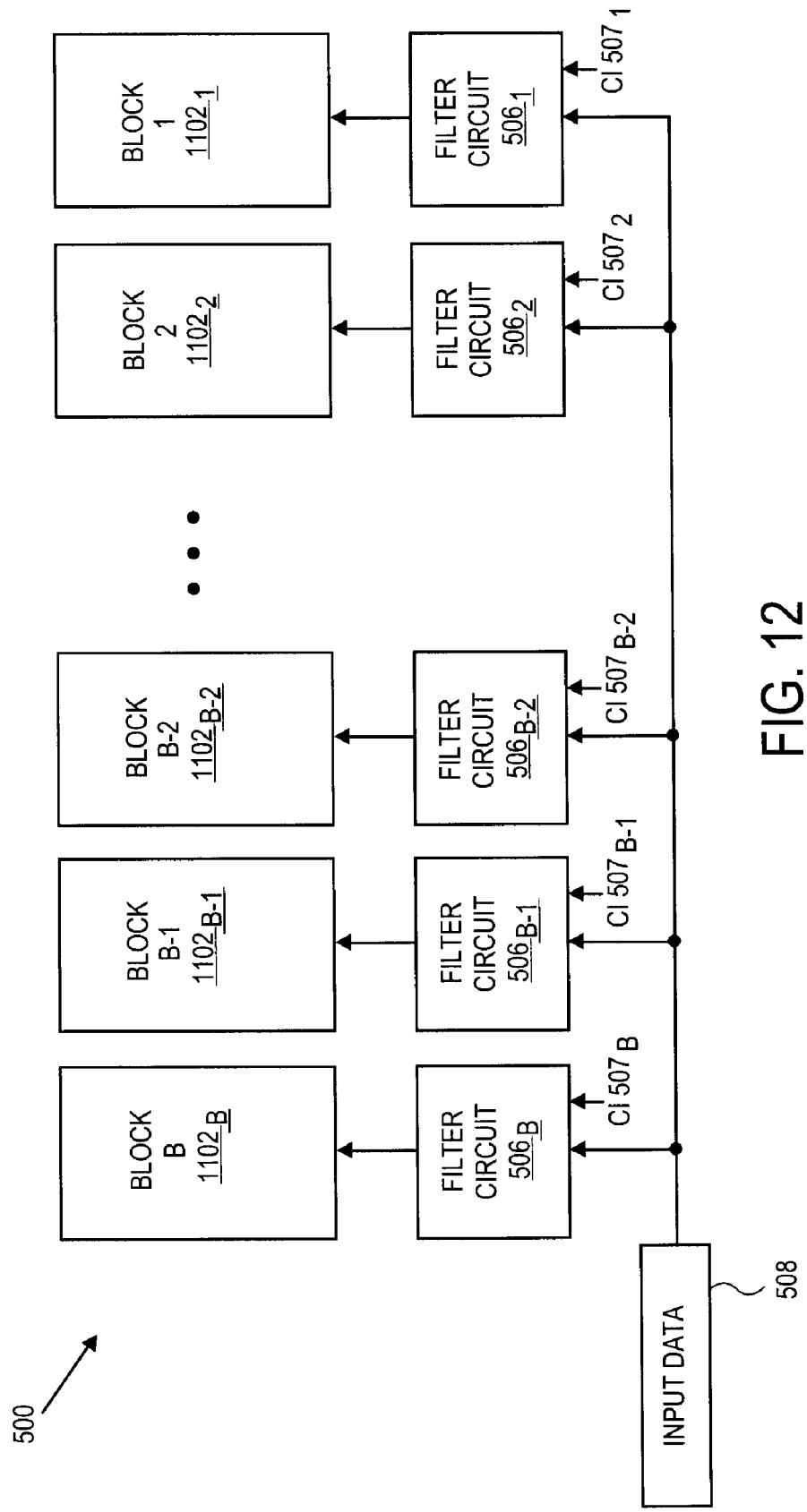
FIG. 12 illustrates another embodiment of a CAM device having multiple CAM blocks.

FIG. 12 shows that CAM device 502 blocked out into B number of CAM array blocks $1102_1$-$1102_B$, each having a corresponding filter circuit $506_1$-$506_B$. Each of the filter circuits $506_1$-$506_B$ operates like the filter circuit 506 of FIG. 5. Each of the filter circuits $506_1$-$506_B$ is operable to filter the input data 508 to generate a corresponding comparand. One or more of the filter circuits $506_1$-$506_B$ may be programmed differently, using different control information CI $507_1$-$507_B$, than the other filter circuits to generate different comparands for lookup in their corresponding CAM block.

Each of the filter circuits $506_1$-$506_B$ may operate concurrently (e.g., overlapping at least at one point in time) to simultaneously perform the filtering function and further increase overall throughput and performance of the device. Alternatively, one or more of the filter circuits $506_1$-$506_B$ may perform its filtering of the input data 508 before or after one of the other filter circuits $506_1$-$506_B$.

As indicated above, each of the filter circuits $506_1$-$506_B$ operate like the filter circuit 506 of FIG. 5 and may each include a switch circuitry 750 and control logic 710 as shown in FIG. 7. Alternatively, one or more of the filter circuits $506_1$-$506_B$ may share control logic 710. For another embodiment, a single one of filter circuits $506_1$-$506_B$ may be shared by more than one block or segment, for example, by routing the output signal lines from a comparand register to more than one block.

As previously mentioned, advantages of the filter circuit architectures discussed herein include its scalability, smaller die area and faster timing for large matrixes than prior filter circuit architectures.

In the foregoing specification, the invention is described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A content addressable memory (CAM) device, comprising:
    a CAM array coupled to receive a comparand; and
    a filter circuit coupled to the CAM array, wherein the filter circuit is coupled to receive input data, the input data including a first bit having a first position and a second bit having a second position being one of before or after the first position in the input data, wherein the filter circuit is configured to form a comparand from the input data by providing the first bit in the first position and transposing the second bit with a third bit in a third position in the comparand, the third position being the other of before or after the first position,
    wherein the filter circuit is configured to form the comparand from the input data without moving any bit in the input data other than the bit in the second position and the bit in the third position,
    wherein the third position is different than the first position and the second position, and
    wherein the filter circuit comprises switch circuitry coupled to receive the input data, and control logic coupled to the switch circuitry.

2. The CAM device of claim 1, wherein the second position is after than the first position in the comparand, and wherein the third position is before than the first position in the comparand.

3. The CAM device of claim 1, wherein the second position is before than the first position in the comparand, and wherein third position is after than the first position in the comparand.

4. The CAM device of claim 1, further comprising a comparand register coupled between the CAM array and the filter circuit to store the comparand.

5. The CAM device of claim 1, wherein the filter circuit is configured to replace a third one or more bits of the input data having the third position in the input data with the second bit into the third position in the comparand.

6. The CAM device of claim 1, wherein the control logic comprises a plurality of logic cells, each configured to receive an A operand and a B operand and to perform an AB logic operation.

* * * * *